(12) United States Patent
Khurana et al.

(10) Patent No.: US 10,796,041 B1
(45) Date of Patent: Oct. 6, 2020

(54) COMPACTING TEST PATTERNS FOR IJTAG TEST

(71) Applicant: Cadence Design Systems, Inc., San Jose, CA (US)

(72) Inventors: Rajesh Khurana, Noida (IN); Vivek Chickermane, Slaterville Springs, NY (US); Divyank Mittal, Noida (IN); Balveer Singh Koranga, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/389,733

(22) Filed: Apr. 19, 2019

(51) Int. Cl.
*G06F 30/30* (2020.01)
*G01R 31/3185* (2006.01)

(52) U.S. Cl.
CPC ..... *G06F 30/30* (2020.01); *G01R 31/318533* (2013.01)

(58) Field of Classification Search
CPC ...... G06F 30/30; G06F 30/33; G06F 30/3308; G01R 31/318533; G01R 31/3185
See application file for complete search history.

(56) References Cited

U.S. PATENT DOCUMENTS

| 2008/0065940 A1* | 3/2008 | Wang | G06F 11/2236 |
| | | | 714/729 |
| 2012/0233514 A1* | 9/2012 | Patil | G01R 31/318508 |
| | | | 714/734 |

* cited by examiner

*Primary Examiner* — Vuthe Siek
(74) *Attorney, Agent, or Firm* — Schwegman Lundberg & Woessner, P.A.

(57) ABSTRACT

Systems, methods, media, and other such embodiments described herein relate to improved operation of test devices which verify circuit operations. One embodiment involves accessing a circuit design comprising a plurality of instances of one or more blocks, where each block of the one or more blocks is associated with a corresponding block test pattern comprising one or more test subpatterns. Each corresponding block test pattern is processed to identify independent test subpatterns, and then each instance is processed to identify each independent test subpattern for the circuit design. Similar types of independent test subpatterns are merged into a circuit design test pattern, such that at least two of the independent test subpatterns associated with the circuit design occupy shared test cycles within the circuit design test pattern.

20 Claims, 7 Drawing Sheets

500

502 — ACCESSING, USING ONE OR MORE HARDWARE PROCESSORS, A CIRCUIT DESIGN STORED IN MEMORY, THE CIRCUIT DESIGN COMPRISING A PLURALITY OF INSTANCES OF ONE OR MORE BLOCKS, WHEREIN EACH BLOCK OF THE ONE OR MORE BLOCKS IS ASSOCIATED WITH A CORRESPONDING BLOCK TEST PATTERN COMPRISING ONE OR MORE TEST SUBPATTERNS, WHEREIN THE CIRCUIT DESIGN IS ASSOCIATED WITH A CIRCUIT DESIGN TEST PATTERN, AND WHEREIN THE CIRCUIT DESIGN TEST PATTERN IS ASSOCIATED WITH A PLURALITY OF TEST CYCLES

504 — PROCESSING, USING THE ONE OR MORE HARDWARE PROCESSORS, A FIRST BLOCK OF THE ONE OR MORE BLOCKS TO IDENTIFY A SET OF INDEPENDENT TEST SUBPATTERNS FOR THE FIRST BLOCK

506 — PROCESSING, USING THE ONE OR MORE HARDWARE PROCESSORS, A FIRST INSTANCE OF THE FIRST BLOCK TO IDENTIFY FIRST ONE OR MORE TEST SUBPATTERNS ASSOCIATED WITH THE FIRST INSTANCE OF THE FIRST BLOCK

508 — MERGING THE FIRST ONE OR MORE TEST SUBPATTERNS ASSOCIATED WITH THE FIRST INSTANCE OF THE FIRST BLOCK INTO THE CIRCUIT DESIGN TEST PATTERN SUCH THAT AT LEAST ONE TEST SUBPATTERN OF THE FIRST ONE OR MORE TEST SUBPATTERNS IS ASSIGNED TO A FIRST TEST CYCLE THAT IS ALSO ASSIGNED TO A SECOND TEST SUBPATTERN OF THE ONE OR MORE TEST SUBPATTERNS

510 — INITIATING TEST OF CIRCUIT USING THE CIRCUIT DESIGN TEST PATTERN WITH THE FIRST TEST CYCLE ASSIGNED TO THE FIRST TEST SUBPATTERN AND THE SECOND TEST SUBPATTERN SUCH THAT THE CIRCUIT IS TESTED USING THE FIRST TEST SUBPATTERN AND THE SECOND TEST SUBPATTERN DURING A SAME TIME PERIOD ASSIGNED TO THE FIRST TEST CYCLE

*FIG. 5*

COMPACTING TEST PATTERNS FOR IJTAG TEST

TECHNICAL FIELD

Embodiments described herein relate to electronic design automation (EDA), and to systems, methods, devices, and instructions for generating circuit designs with test points.

BACKGROUND

Electronic design automation (EDA) is a category of systems for assisting with the design of electronic systems and devices. Large integrated circuit designs are often assembled from previously designed blocks, which enables reduced turnaround times for generation of an integrated circuit. Verification that the circuits have been fabricated correctly may then involve the use of test machines to verify that the chip is manufactured correctly and meets design specifications.

BRIEF DESCRIPTION OF THE DRAWINGS

Various ones of the appended drawings merely illustrate example embodiments of the present disclosure and should not be considered as limiting its scope.

FIG. 5 illustrates a method for compacting test patterns in accordance with some embodiments.

DETAILED DESCRIPTION

Embodiments described herein relate to EDA and to methods, computer media, and devices used for analyzing, testing, optimizing, and creating electronic circuits.

Particular embodiments include generation of compacted test patterns for improved test flow. Various embodiments improve the operation of test machines by reducing the amount of time to test a single circuit. For increasingly complex circuit designs (e.g., application specific integrated circuits (ASICs), systems on a chip (SOCs), etc.), this reduction may involve significant efficiencies in test machines. For example, a single circuit design and the associated fabricated circuit may include multiple ready-made integrated functional blocks (IP blocks) which provide special functionalities. Each IP block has an associated set of test cycles to verify operation of a circuit after fabrication, and each instance of an IP block in a design may involve repetition of the confirming test cycles. Thus, a single circuit may have ten different IP blocks, and multiple instances of some of those ten IP blocks, such that twenty block instances need to be tested to verify the circuit. If each instance of an IP block in a circuit uses an average number of 50,000 test cycles to test, then each circuit will use approximately 1,000,000 test cycles under previous systems. Embodiments described herein include specific embodiments for merging certain test operations to reduce the number of test cycles needed for testing of an individual circuit. A test machine may thus test a circuit device using fewer test cycles (e.g., improving device operation by reducing device resource usage) by using the embodiments described herein. Some specific embodiments are configured for compacting test patterns for Institute of Electrical and Electronic Engineering (IEEE) 1687 standards for Internal Joint Test Action Group (IJTAG)-standard test access port and boundary scan operation compliance. Specific embodiments describing operations to achieve such improvements are described in detail below.

Figure 1:
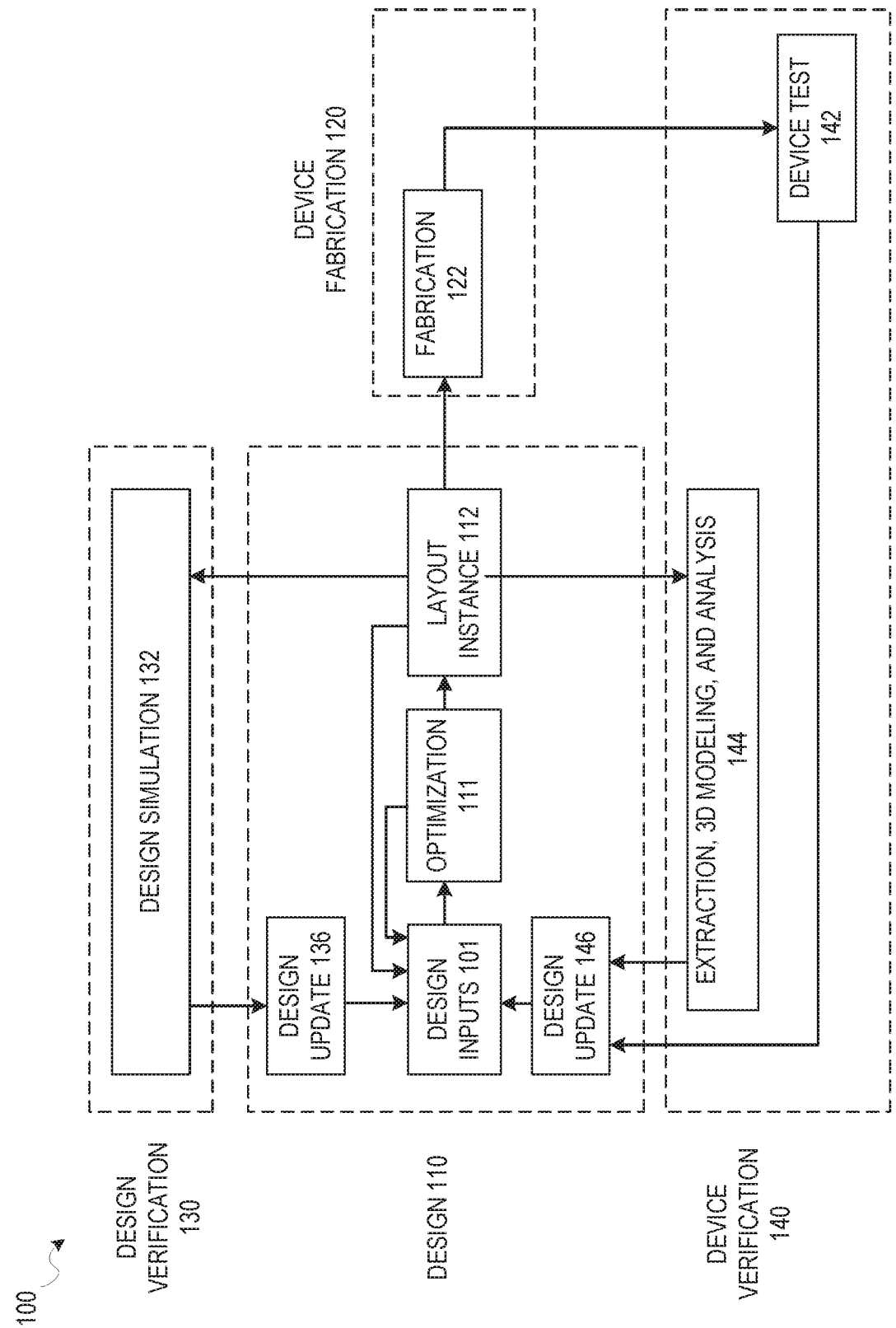
FIG. 1 is a diagram illustrating one possible design process flow which includes elements for device test in accordance with various embodiments.

FIG. 1 is a diagram illustrating one possible design process flow that includes elements for device test in accordance with some embodiments described herein. It will be apparent that other design flow operations may function using embodiments described, but a design flow 100 is described here for the purposes of illustration. Embodiments described herein are primarily related to generation of test patterns from a circuit design which are then used during a device test 142. As illustrated, the overall design flow 100 includes a design phase 110, a device fabrication phase 120, a design verification phase 130, and a device verification phase 140. The design phase 110 involves an initial design input operation 101 where the basic elements and functionality of a device are determined, as well as revisions based on various analyses and optimization of a circuit design. This design input operation 101 is where initial layouts for a circuit design are generated. The initial strategy, tactics, and context for the device to be created are also generated in the design input operation 101, depending on the particular design algorithm to be used. A testability analysis may be performed at any point following generation of the initial design. Similarly, full operations for design for test (DFT) may be performed following generation of the initial design or at any place in the circuit design process flow described herein.

Updates to a design may be performed at any time to improve expected operation of a circuit design. For example, in various embodiments, constraints for blocks in a circuit design may be generated prior to routing of connections in a circuit design; after routing; during register transfer level (RTL) operations; or as part of a final signoff optimization or verification prior to a device fabrication operation 122. Certain embodiments of operations described herein for generating or updating circuitry for test coverage may therefore involve iterations of the design input operation 101, an optimization operation 111, and layout instance 112 generation.

After design inputs are used in the design input operation 101 to generate a circuit layout, and any optimization operations 111 are performed, a layout is generated as the layout instance 112. The layout describes the physical layout dimensions of the device that match the design inputs. This layout may then be used in the device fabrication operation 122 to generate a device, or additional testing and design updates may be performed using designer inputs or automated updates based on design simulation 132 operations or extraction, three-dimensional (3D) modeling, and analysis 144 operations. Once the device is generated, the device can be tested as part of device test 142 operations, and layout modifications generated based on actual device performance. Each instance of device fabrication associated with a circuit design iteration may then further involve generation of compacted test patterns associated with a specific circuit design as part of embodiments described herein, and then use of those compacted test patterns to test the corresponding fabricated devices in the device test 142 operations.

Design updates 136 from the design simulation 132 operations, design updates 146 from the device test 142 or extraction, 3D modeling, and analysis 144 operations, or the design input operation 101 may occur after the initial layout instance 112 is generated. In various embodiments, whenever design inputs are used to update or change an aspect of a circuit design, a timing analysis and optimization operation 111 may be performed. Each iteration of a circuit design may thus be associated with new compacted test patterns in various embodiments. In other systems, other design processes may be used.

Figure 2:
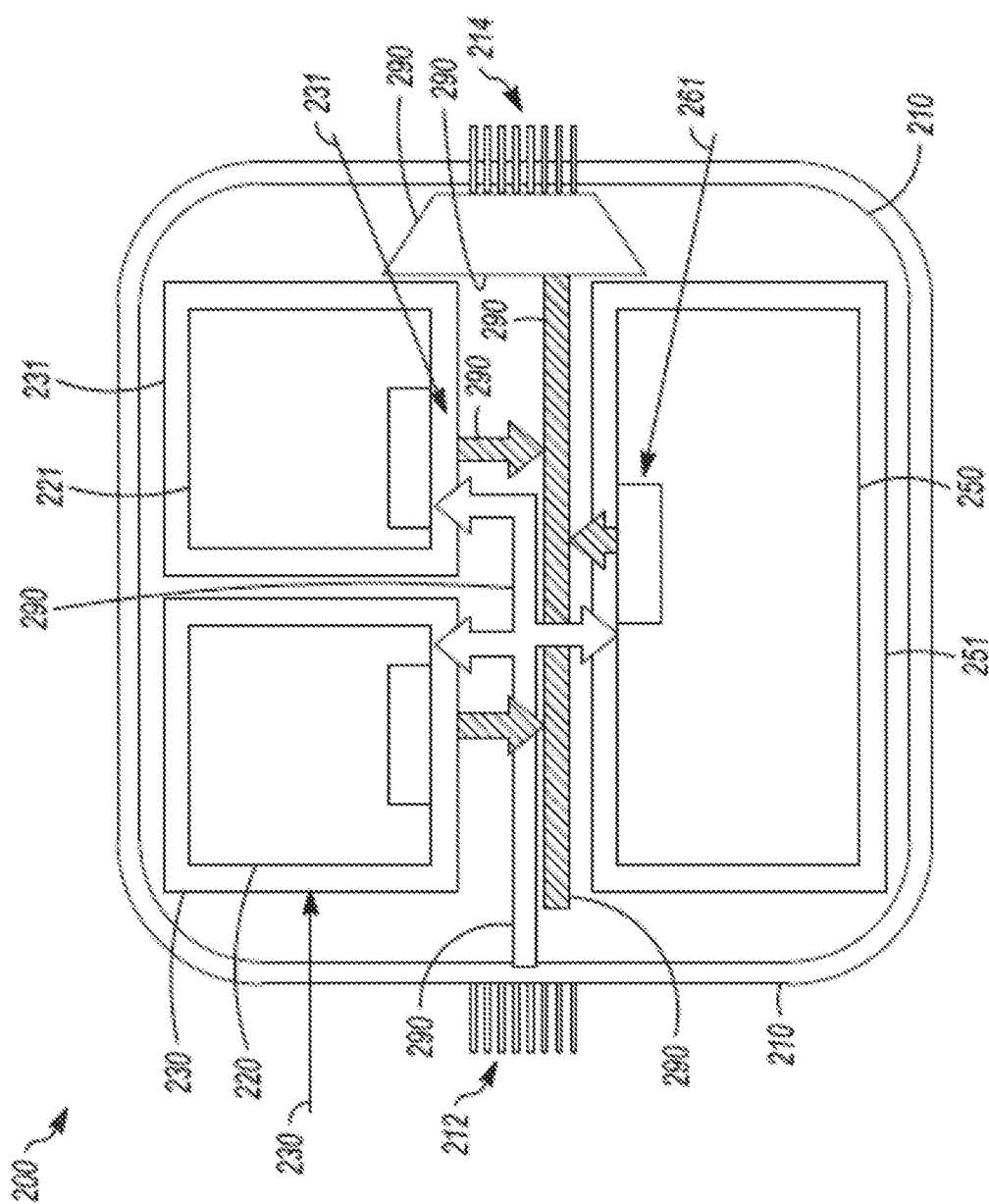
FIG. 2 illustrates aspects of circuit designs with integrated blocks (IP blocks) in accordance with various embodiments.

FIG. 2 illustrates aspects of circuit designs with integrated blocks (IP blocks) in accordance with various embodiments. FIG. 2 illustrates an example circuit design 200, which may be used with embodiments described herein. As shown, the circuit design 200 is an SOC with multiple block instances 220, 221, and 250. A block (e.g., IP block or circuit block) as described herein is a premade subcircuit that provides special functionalities and is placeable within the larger circuit design as a complete subsystem. Such a block simplifies the overall circuit design by allowing the designer of the overall circuit to place a block representing groupings of other circuit elements rather than having the designer place each of those elements individually. Each copy of a block placed into a circuit design is referred to as an instance of a block. In FIG. 2, the instances 220 and 221 are copies of a first block, and the instance 250 is an instance of a second block different from the first block.

Such blocks enable ASIC designs and SOC circuit designs to be more complex with each new iteration in design and with more and more functionality added on the chip. These ready-made blocks provide all the logic for the specified functionality. In some instances, the blocks come from various different sources and are then integrated on the SOC, by an SOC designer or engineer who may not have much understanding of the contents of the block. To test these blocks efficiently is a challenge, as many such blocks contain logic which is not necessarily compatible with other design tools and other blocks. To resolve this problem, each block is associated with test data at the block boundary, which may be used to test the blocks. One of the tasks then is to migrate or retarget this test data from the block boundary to the top-level chip boundary, from where it can be administered. In FIG. 2, inputs 212 and outputs 214 of a chip boundary 210 are shown. Also as illustrated, the instance 220 is associated with a block boundary 230, the instance 221 is associated with a block boundary 231, and the instance 250 is associated with a block boundary 251. A test access network 290 is also present to enable the communication of data between the primary inputs 212, the primary outputs 214, and the various instances 220, 221, 250 within the circuit design 200.

The Institute of Electrical and Electronic Engineers (IEEE) 1687 standard provides a way to define this test data at the boundary for a block which may be applied for each instance of a block within a circuit design. This IEEE 1687 standard also uses a standardized interface (IEEE 1500 interface) for the test access mechanism to control and observe this test data from the chip boundary 210 via the primary inputs 212 and primary outputs 214 at the chip boundary 210. An IEEE 1687 standard-based pattern migration tool can then read and understand the test data at the block boundaries and migrate the test data to the chip-level boundary. For example, in FIG. 2, data at the block boundary 230 is defined by the standardized test data associated with the block that the instance 220 is a copy of. A pattern migration tool can automatically take data from the block boundary 230 and translate it (e.g., translate values and timings) from the block boundary 230 to the chip boundary 210. In other words, the output and input values and timings at the block boundary 230 can be translated into corresponding input and output timings and values that would occur at the chip boundary 210 in accordance with the same block boundary 230 data. Inputs at the block boundary 230, for example, are translated to data values at the chip boundary such that an isolated path can be created to access the block under test and the data values and timings from the chip boundary are applied correctly at the block boundary (e.g., the value and earlier timing at the input 212 that would result in the correct corresponding later input at the block boundary 230 at the correct time). A corresponding similar structure is in place for the output side, with output data values at the block boundary 230 are translated to data values at the chip boundary (e.g. output 214) such that an isolated path can be created to determine outputs for the block under test at the chip boundary (e.g., the value and later timing at the output 214 that would result from an output at the block boundary 230).

In some embodiments, a standard format provides the following components to describe the test data at the instrument level: Instrument Connectivity Language (ICL) data and Procedural Description Language (PDL) data. ICL data is from a language similar to Verilog to describe the ports and connectivity of a block under test and an access network to the test instrument (e.g., a tester connected to a fabricated copy of the circuit design 200, which is not shown in FIG. 2). This contains only a subset of information used to form the behavioral model that is needed for test pattern migration. The PDL data is data to describe the tester's (e.g., test instrument's) test data at a block interface and at internal scan register(s) 261. This is used for describing the actual test data for scan tests as well as for functional and algorithmic tests.

Figure 3:
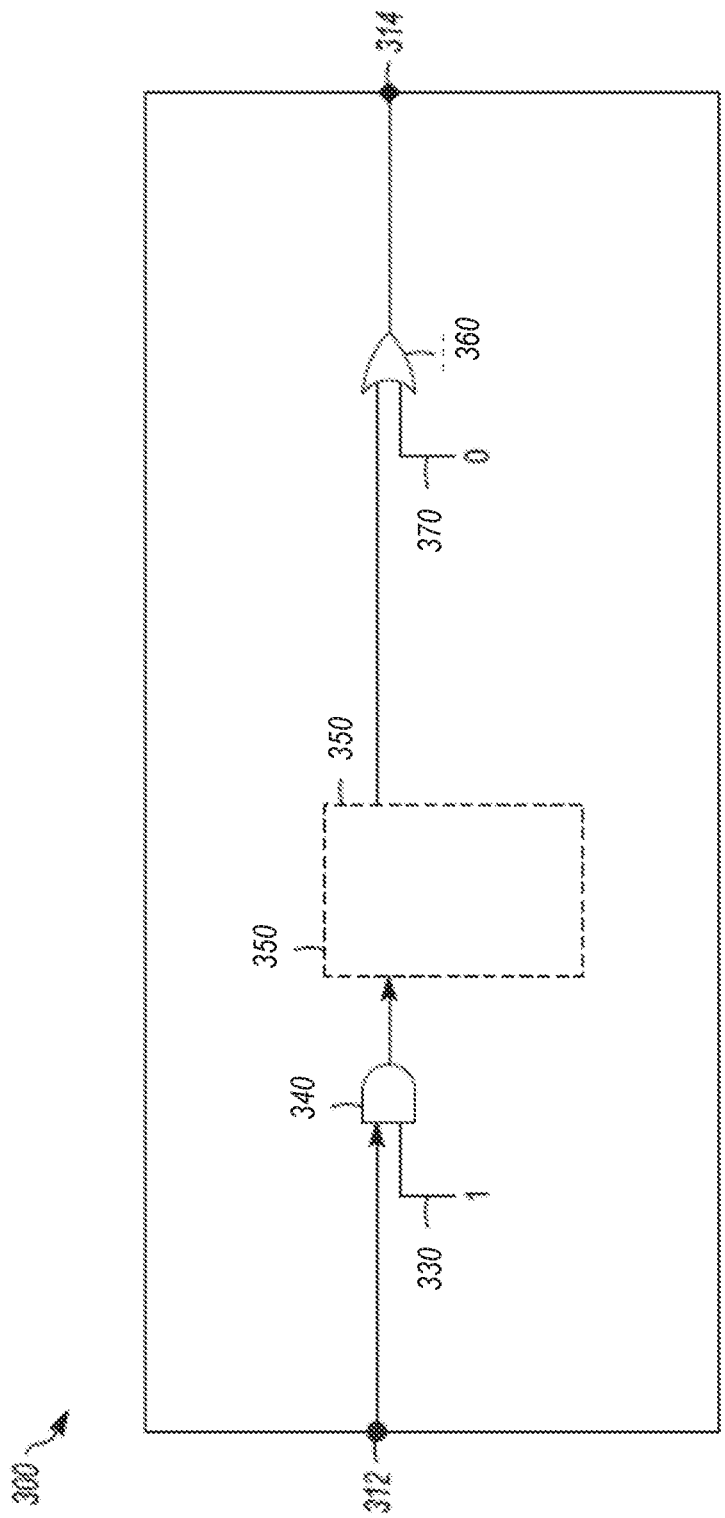
FIG. 3 illustrates aspects of test pattern use in accordance with various embodiments.

FIG. 3 illustrates aspects of test pattern use in accordance with various embodiments. When a circuit is fabricated, a test pattern may be generated to test the functionality of the circuit design, including all of the test details provided for each instance of each block within the circuit design. As described above, such test patterns for an instance of a block may be translated to corresponding test patterns at the chip boundary in order to allow testing of an instance of a block within a circuit design.

The test patterns at the instance level are a series of stimulation inputs and measure data responses at the block boundary or within the block's internal test data registers (TDRs), which are measurable via inputs and outputs at the block boundary. A pattern migration tool extracts a set of corresponding pins at the chip-level boundary that can be used to control these block-level pins at a block's internal TDRs. Similarly, on the output side, a set of pins that can be used to observe the data from the block is also identified. However, to be able to control and observe the block information from their corresponding boundaries at the chip level, a clear path needs to be established between the block and the corresponding chip-level pins (e.g., input pins at the input 212 and output pins at the output 214). To achieve this, a set of non-controlling values are applied at the intermediate logic (e.g., as part of the test access network 290). This is also justified back to the chip-level pins at the top level called preconditioning pins, and this allows the correspondence (e.g., the translatable pattern between the chip boundary and the block boundaries) to be established.

Such test operations are illustrated by a simplified circuit design 300 of FIG. 3. In FIG. 3, a single block 350 shown as connected to a test access network element 340 and a test access network element 360. Preconditioning values 330 and 370 are values that are justified back via scan cells to confirm the operation of the test access network. When the pattern associated with the block 350 is implemented as part of a test operation, the corresponding input values will be provided at an input 312, which are then translated to an input of the block 350. Similarly, outputs from the block 350 will translate to an output 314. As described above, the pattern migration tool provides a translation from the provider test data for the block associated with the block 350, and the corresponding data at the input 312 and the output 314.

In various systems, the test data for a block and the instrument to be used with test patterns to test a fabricated circuit is coded in PDL syntax and is provided by the block provider. This test data consists of a sequence of test vectors that can be applied by a test instrument at the chip boundary (e.g., the chip boundary 210). In previous systems, test patterns for each block are applied serially at the chip boundary. Even when a circuit design contains multiple instances of the same block with the same test patterns, these patterns are applied separately and serially without any verification of possible repetitions or variations based on the correspondence. When these test patterns are applied from the chip boundary, they are simply applied for one instance at a time. However, there are scenarios where the instances have common inputs and related outputs, so that a test pattern submitted at the chip boundary can be applied in parallel from the chip boundary onto multiple instances of a block within the chip. This includes instances of the same block and instances of different blocks. For example, certain inputs may have timing patterns that leave the test access network unutilized for certain times, and embodiments described herein may use such periods to merge portions of test patterns for other portions of the circuit design. In order for such merged test patterns to operate, however, the test hardware needs to be able to support the application of such merged test patterns as well as measure the test outputs at the top-level chip interface pins. Embodiments described herein define specific implementations for merging of test patterns from multiple instances of blocks within a circuit design and applying them in a set of compacted patterns from the chip-level interface, thereby resulting in considerable saving in test application time, improving the operation of test machines and increasing the total number of test patterns and the test data volume as part of test machine performance.

Various embodiments described herein merge patterns from individual instances of different blocks to generate a compacted test pattern for a circuit design to perform equivalent tests, with the aim of minimizing the total test application time that can be achieved. Using such embodiments, a serialized set of test patterns for each instance of each block within a circuit design may be merged into a significantly shorter test pattern that improves the performance of a test device by performing the same test operations in a shorter time period. Such operations may be considered to work by breaking the test patterns into small pieces (e.g., subpatterns) and then merging each individual subpattern separately to create a merged test pattern for the circuit design that includes all of the subpatterns for each instance within a smaller set of test cycles than the serial application of each subpattern in a larger number of test cycles. The first step in this pattern merging is to identify or extract a set of subpatterns that can be applied independently for each block. These are the subpatterns within the test data for each block that can be executed separately. The next step in pattern merging is to identify the type of test patterns associated with each subpattern, and then to attempt to merge similar subpatterns to create a single compacted test pattern for a circuit design. As the circuit design is updated, additional test cycles will perform the merging again to deal with changes in the test operations due to changes in the circuit design. Such steps may be repeated for the complete set of merging patterns for each of the participating blocks, to generate a final merged set of patterns which can be applied to a circuit, and that will achieve the same result in much less test time and with fewer associated tester cycles than the sequential testing of each instance within a circuit design.

Figure 4:
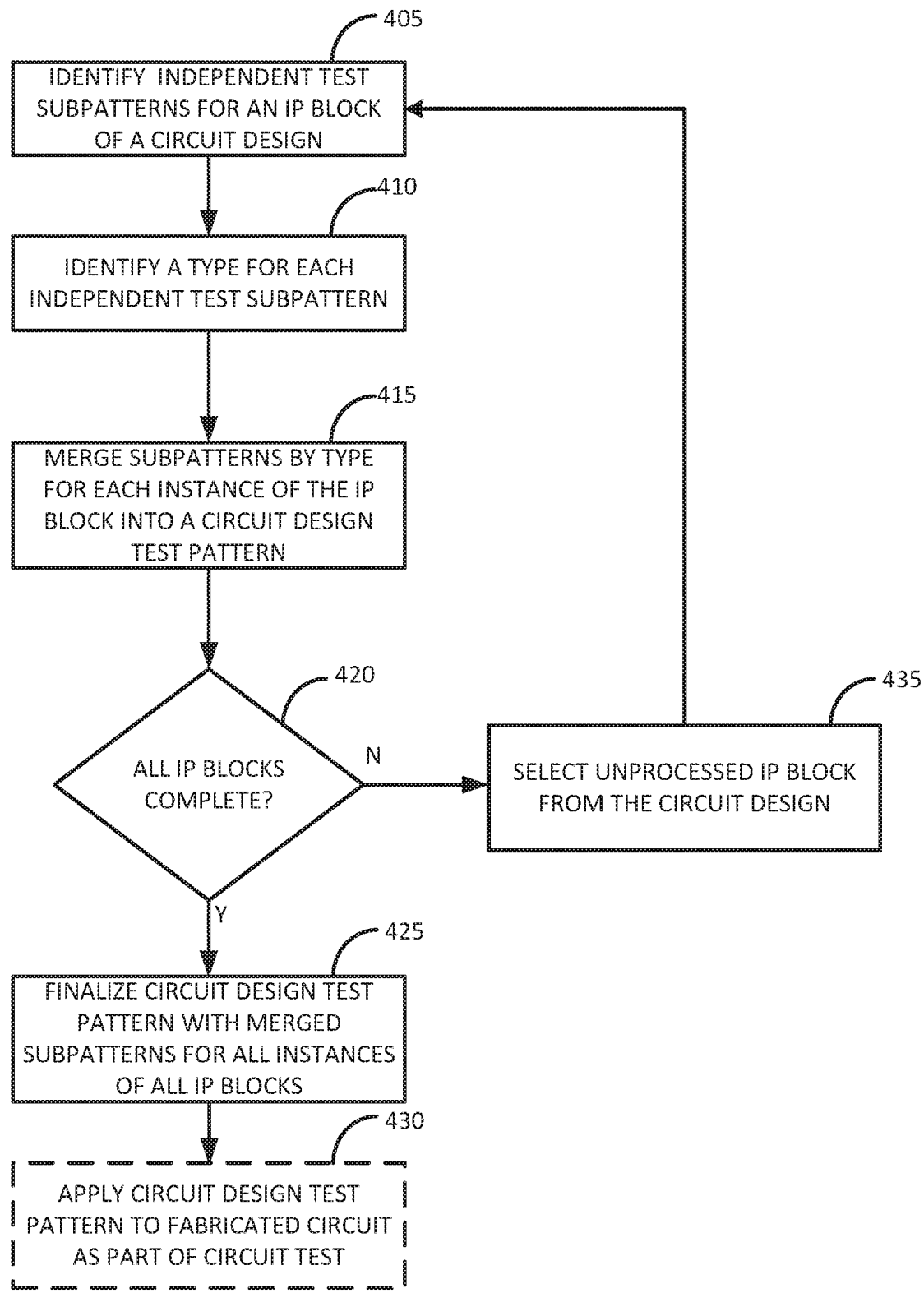
FIG. 4 illustrates aspects of compacting test patterns for circuit testing in accordance with various embodiments.

FIG. 4 illustrates aspects of compacting test patterns for circuit testing in accordance with various embodiments. The illustrated embodiment of FIG. 4 begins with operation 405 of identifying independent test subpatterns for a block of a circuit design. In this operation, instances do not need to be considered separately, as the associated test data for instances of the same block are the same. The test pattern for a block is analyzed to identify subpatterns or subgroupings which may be applied separately. Subpatterns are applied together, such as input stimulations and the associated expected measured outputs. A test device may operate using test cycles, and the subpatterns identified in operation 405 may use any number of test cycles that occur together. Once all of the independent test subpatterns for a block are identified, then in operation 410, these subpatterns are each associated with a subpattern type. As described in further detail below, different subpatterns of different types may merge together in different ways. For example, some types of test subpatterns may not be manageable with other types of test subpatterns. Identifying types for different test subpatterns enables efficient merging operations for creation of an efficient final merged test pattern for the circuit design.

Once a type is determined for each test subpattern, in operation 415, the independent test subpatterns for each instance of the associated block within a circuit design are merged. In some embodiments, these independent test subpatterns are merged into intermediate merge groups which are then later merged into the complete test pattern for the circuit design. In other embodiments, each independent test subpattern for each instance of the block is merged into a test pattern for the circuit design. Such a test pattern for the circuit design may essentially serve as an empty template which is built up using the subpatterns from each instance of each block until all test data from every instance in the circuit design is included, which results in the final test pattern for the circuit design. As described in FIG. 4, in operation 420, after the subpatterns for each instance of an individual block are merged in operation 415, the system determines if any blocks are remaining to be considered. If blocks remain to be considered, then in operation 435, an unprocessed block from the circuit design is selected, and operations 405 through 420 are repeated until all blocks have been processed. Once all blocks are processed, in operation 425, the circuit design test pattern is finalized with the merged subpatterns for all instances of all blocks within the circuit design. This finalized test pattern includes all data that would otherwise have been applied in a serialized format merged into a compacted and more time-efficient set of test cycles for use by a test machine in testing fabricated circuits which use the circuit design. In operation 430, such a test machine applies the test pattern to one or more fabricated circuits, with the operation of the testing fabricated circuit is improved by using the merged test pattern for the circuit design.

In some embodiments, the categorization of independent subpatterns uses the following groupings: (1) stimming some values on the input pins; (2) observing values at the output pins; (3) pulsing of test and functional clocks; (4) waiting for cycles of free-running clock; (5) loading data on a test data register; and (6) unloading of data from the scan chain. Within such groupings of operations, certain groups typically form independent subpatterns as operations which occur together as a subpattern type.

An initial independent subpattern type includes patterns for IP pins stimming/measuring. For operations within this subpattern type, the test subpatterns are simply merged by deriving the equivalent pattern at the chip level for the corresponding pins for each instance, and then merging these chip-level patterns into a single compacted pattern, where the care bits do not clash. Care bits are bits within a test pattern or subpattern that are associated with testing of a particular fault or subportion of a circuit, as opposed to other bits, which are unused due to timing delays or other patterns within the test data. For example, a test pattern may have a set of care bits preceded and followed by other non-care bits which are present due to timing issues or other such considerations. Merging operations may be structured as, for each instance-level test pattern, accessing the equivalent corresponding test pattern at the chip; merging this pattern into a single compacted pattern, where there is no clash in the care bits; and repeating these merge operations for all the instances participating in merging. The output patterns are similarly merged into a single compacted pattern at the chip level, that is equivalent to each of the individual instance patterns, such that the expected outputs are merged to prevent clashes.

Another independent subpattern type includes patterns for pulsing of clocks & waiting for oscillator cycles (e.g., groups 3 and 4 above). For patterns associated with testing of such operations, when merging clock pulses, the merged patterns are configured to wait (e.g., pulse) for a minimum number of cycles that are enough to achieve the pulse/hold time for each of the merging instances. Thus, for each clock pulse at the instance, the system will get the equivalent corresponding clock pulse at the chip, and repeat this for all instances participating in merging. Clock pulses are analyzed for merging such that if the same clock at the chip level needs to be pulsed, the resultant number of pulses will be a maximum of all individual clock pulses at each of the instances. If different clocks need to be merged to avoid conflicts, the result will be to pulse all the clocks together in the order provided, within the same pattern, for the specified cycles for each clock. In case of free-running clocks, the wait time will be the maximum total wait time of any individual clock and will be integral multiples of a tester clock frequency, so that separate tests for such clocks are not necessary as they would simply repeat the same test patterns at the chip boundary. For sensing the outputs of such operations, a compacted set of patterns at the chip level that will perform pulse/wait for the same set of clocks, with minimum wait time for the combined group, are used.

A third type of independent subpatterns includes patterns for scan_load and scan_unload (e.g., categories 5 and 6 above). Such operations include additional complexity, since loading of data in a scan chain has an associated scan protocol attached. While trying to merge the scan data from each of the individual blocks, a system needs to consider scan preconditioning; scan ports used for loading/unloading of test data; scan clocks being pulsed; and scan exit protocols. In many systems, a scan protocol is not present along with an individual set of scan patterns, but instead it is provided separately. Although the actual test applied at the tester for scan consists of loading scan preconditioning data, applying test data with load, unload, and pulsing of scan clocks, and applying a scan exit. The following operations may be used for merging such patterns. For each block scan test pattern, the system accesses the scan protocol, consisting of scan preconditioning, scan exit, and set of scan clocks and scan ports needed to perform the scan operation. Scan patterns for different instances are then merged by accessing the corresponding chip-level ports for the associated ports; merging the scan data at each individual chip-level scanin/scanout where the care bits do not clash (e.g., using merged test data for each scan chain); creating a merged set consisting of all chip-level Scan Ins and scan outs for each individual instance (e.g., using a merged correspondence); merging the scan preconditioning to create a single set of preconditioning data where the preconditioning data does not clash; and merging the scan exits to create a superset of scan exit data.

Such operations are then repeated for all blocks participating in merging, and the final merged set is executed in the order provided. In other words, when merging the independent test subpatterns from different instances of a block, the merging maintains an order of the independent test subpatterns originally provided by the scan protocol or other ordering data. This allows the data to be merged and executed more efficiently by a test machine, while preserving any test information associated with the ordering of the test pattern for the block.

To deal with the merged output, a Superset of Scan patterns at the chip level, consisting of merged scan data, merged correspondence, merged scan preconditioning, and merged scan exit, is configured and associated with a set of merged scan clocks that needs to be pulsed. All the scan chains in participating instances are loaded at the same time and unloaded at the same time if supported by hardware, instead of loading one at a time.

While the above illustrates example groups of test data mergeable as compatible independent test subgroups, it will be apparent that in various other embodiments, other types of independent subpatterns may be identified and used with various combinations of the above-identified operations.

Additionally, in some embodiments, certain test patterns or test subpatterns may not be compatible with being merged with the rest of a group pattern or any set of test pattern data. In such cases, the resultant pattern will be serialized. This means the test pattern that is provided first will be executed first, and no merging will be performed. The next pattern will be executed, and so on. Merger of test patterns thus occurs only where possible, and if merger is not possible, the test pattern is simply placed serially within the overall structure of the test pattern for the circuit design. A test pattern of a circuit design may thus have portions that are merged on either side of portions that are not merged, with the portions of the test pattern executed serially as part of the overall test pattern for the circuit design.

FIG. 5 illustrates a method for compacting test patterns in accordance with some embodiments. FIG. 5 particularly describes a method 500 for compacting test patterns, in accordance with some embodiments. In some embodiments, the method 500 is performed by an EDA computing device with one or more processors, which may be configured for additional EDA operations as part of a circuit design process, which may involve additional operations from FIG. 1. In some embodiments such operations are performed in conjunction with a pattern migration tool operating on a machine, and in some embodiments, such operations are further used in conjunction with a tester that applies test patterns to a fabricated circuit to verify circuit operation. In some embodiments, the method 500 is embodied in computer-readable instructions stored in a non-transitory storage device, such that when the instructions are executed by one or more processors of a device, the device performs the method 500.

The method 500 begins with operation 502 accessing, using one or more hardware processors, a circuit design stored in memory. In such a system, the circuit design comprises a plurality of instances of one or more blocks, with each block of the one or more blocks being associated with a corresponding block test pattern comprising one or more test subpatterns. Also, the circuit design is associated with a circuit design test pattern, and the circuit design test pattern is associated with a plurality of test cycles. Such a circuit design test pattern may be created at any time prior to the testing of fabricated circuit devices. Following this, in operation 504, a first block of the one or more blocks is processed to identify a set of independent test subpatterns for the first block. Such processing may involve any analysis of data groups and subpattern types described above. As further mentioned above, since each instance of a block includes the same test patterns and subpatterns, this analysis only needs to be performed for each block. Then operation 506 involves processing a first instance of the first block to identify first one or more test subpatterns associated with the first instance of the first block, and operation 508 involves merging the first one or more test subpatterns associated with the first instance of the first block into the circuit design test pattern such that at least one test subpattern of the first one or more test subpatterns is assigned to a first test cycle that is also assigned to a second test subpattern of the first one or more test subpatterns. In contrast to operation 504, operations 506 and 508 involve operations performed on test subpatterns for an individual instance of a particular block. Thus, for circuit designs with multiple instances of the first block, operations 506 and 508 will be repeated for each test subpattern of each instance of the first block. In various embodiments, depending on the circuit design, the operations will then further be repeated for multiple different block types. Additionally, depending on the test patterns, various repetitions of merging within subpatterns may be performed for different types of test subpatterns. The merged data is then used for testing of a circuit in operation 510, which involves initiating testing of the circuit using the circuit design test pattern with the first test cycle assigned to the first test subpattern and the second test subpattern such that the circuit is tested using the first test subpattern and the second test subpattern during a same time period assigned to the first test cycle.

Various embodiments involve generating an integrated circuit from a circuit design, and then testing the fabricated circuit as described above in operation 510. In various embodiments, various devices, systems, and methods are used to fabricate devices based on the circuit design. In some embodiments, this includes generation of masks and the use of machinery for circuit fabrication. In various implementations, files generated by embodiments described herein are used to create photolithographic masks for lithography operations used to generate circuits according to a circuit design, where a pattern defined by the masks is used in applying a thin uniform layer of viscous liquid (photo-resist) on the wafer surface. The photo-resist is hardened by baking and then selectively removed by projection of light through a reticle containing mask information. In some implementations, the files are further used for etching patterning, where unwanted material from the surface of the wafer is removed according to details described in the design files, where a pattern of the photo-resist is transferred to the wafer by means of etching agents. In some embodiments, aspects of design files generated according to the operations described herein are used for deposition operations, where films of the various materials are applied on the wafer. This may involve physical vapor deposition (PVD), chemical vapor deposition (CVD), or any such similar processes. Some embodiments may use chemical mechanical polishing, where a chemical slurry with etchant agents is used to planarize the wafer surface; for oxidation, where dry oxidation or wet oxidation molecules convert silicon layers on top of the wafer to silicon dioxide; for ion implantation, where dopant impurities are introduced into a semiconductor using a patterned electrical field; or for diffusion, where bombardment-induced lattice defects are annealed. Thus, in various embodiments, systems and operations include not only computing devices for generating updated circuit design files, but also hardware systems for fabricating masks and controlling integrated circuit (IC) fabrication hardware, and the hardware and operations for fabricating a circuit from a circuit design (e.g., component arrangement) generated in accordance with various embodiments described herein.

Following such operations to fabricate a circuit, the circuit may be connected to a tester machine which accepts the compacted test patterns generated in accordance with embodiments described herein, and applies the test patterns to the fabricated circuit to verify the operation of the circuit. As described above, the use of compacted test patterns significantly improves the operation of the tester machine by reducing machine resources needed to test individual circuit devices (e.g., via reduction of the number of test cycles used by large percentages, which may involve many hours of machine time).

Additionally, it will be apparent that any apparatus or operations described herein in accordance with various embodiments may be structured with intervening, repeated, or other elements while still remaining within the scope of the contemplated embodiments. Some embodiments may include multiple receivers, along with any other circuit elements. Some embodiments may function with described operating modes as well as other operating modes. The various embodiments described herein are thus presented as examples, and do not exhaustively describe every possible implementation in accordance with the possible embodiments.

Figure 6:
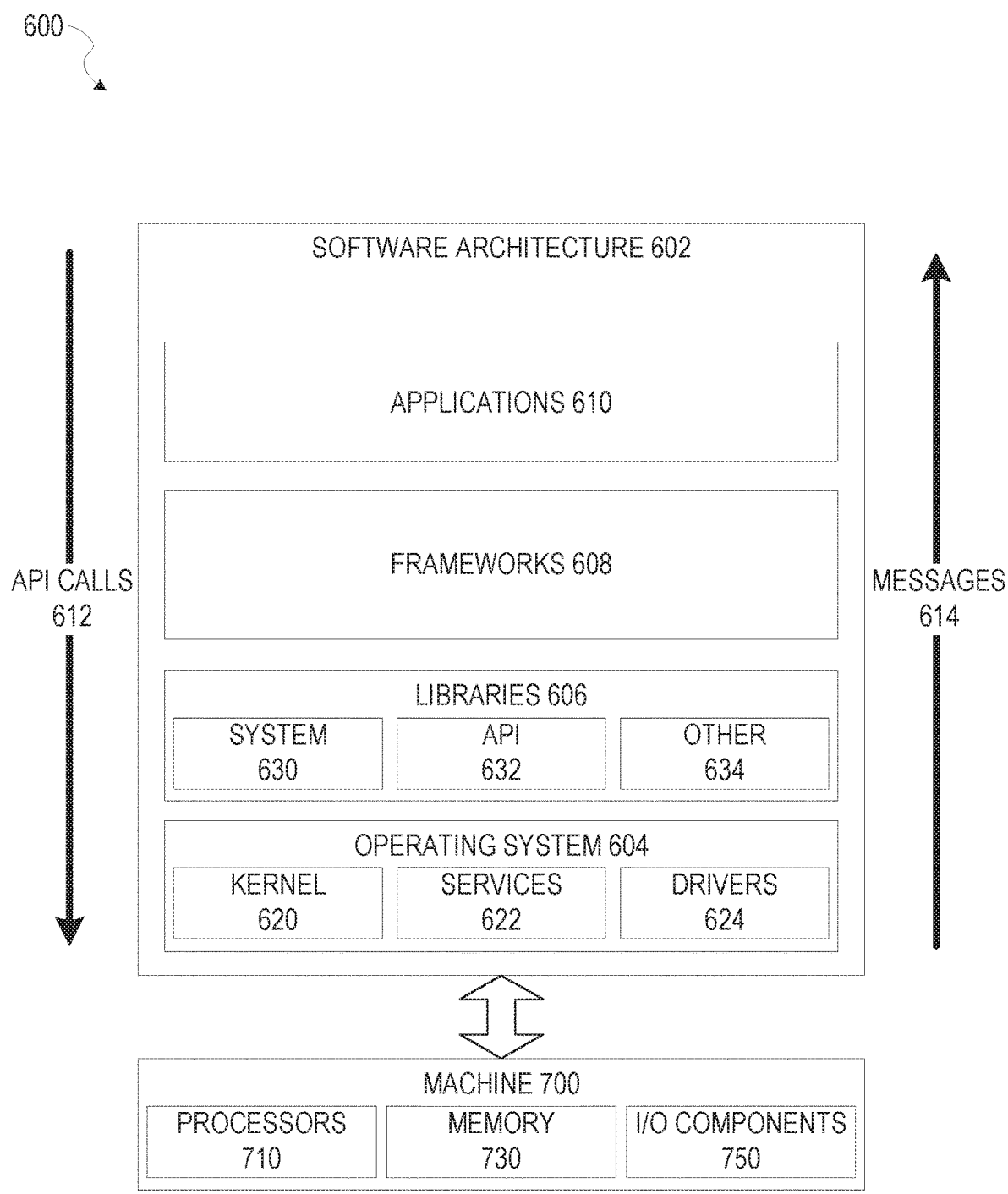
FIG. 6 is a block diagram illustrating an example of a software architecture that may be operating on an EDA computer and used with methods for compacting test patterns and/or circuit testing, according to some example embodiments.

FIG. 6 is a block diagram 600 illustrating an example of a software architecture 602 that may be operating on any machine described herein and associated with compacting of test patterns and use of such test patterns in testing fabricated circuits. The software architecture 602 can be used with a pattern migration tool, a tester machine, or any electronic design automation computing device to implement any of the methods described above. Aspects of the software architecture 602 may, in various embodiments, be used to store circuit designs, test patterns, or any other such information in association with generation and testing of a circuit design and physical devices generated using these circuit designs.

FIG. 6 is merely a non-limiting example of a software architecture 602, and it will be appreciated that many other architectures can be implemented to facilitate the functionality described herein. In various embodiments, the software architecture 602 is implemented by hardware such as a machine 700 that includes processors 710, memory 730, and input/output (I/O) components 750. In this example, the software architecture 602 can be conceptualized as a stack of layers where each layer may provide a particular functionality. For example, the software architecture 602 includes layers such as an operating system 604, libraries 606, software frameworks 608, and applications 610. Operationally, the applications 610 invoke application programming interface (API) calls 612 through the software stack and receive messages 614 in response to the API calls 612, consistent with some embodiments. In various embodiments, any client device, server computer of a server system, or any other device described herein may operate using elements of the software architecture 602. An EDA computing device described herein may additionally be implemented using aspects of the software architecture 602, with the software architecture 602 adapted for compacting test patterns and testing circuits in accordance with embodiments described herein.

In one embodiment, an EDA application or pattern migration tool of the applications 610 performs operations described herein for compacting test patterns for test flow according to embodiments described herein, using various modules within the software architecture 602. For example, in one embodiment, an EDA computing device similar to the machine 700 includes the memory 730 and the one or more processors 710.

In various other embodiments, rather than being implemented as modules of one or more applications 610, some or all of the modules used for generating compacted test patterns and using such test patterns may be implemented using elements of the libraries 606 or operating system 604.

In various implementations, the operating system 604 manages hardware resources and provides common services. The operating system 604 includes, for example, a kernel 620, services 622, and drivers 624. The kernel 620 acts as an abstraction layer between the hardware and the other software layers, consistent with some embodiments. For example, the kernel 620 provides memory management, processor management (e.g., scheduling), component management, networking, and security settings, among other functionality. The services 622 can provide other common services for the other software layers. The drivers 624 are responsible for controlling or interfacing with the underlying hardware, according to some embodiments. For instance, the drivers 624 can include display drivers, signal processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 606 provide a low-level common infrastructure utilized by the applications 610. The libraries 606 can include system libraries 630, such as libraries of multi-instance blocks for use in an EDA environment or other libraries that can provide functions such as memory allocation functions, string manipulation functions, mathematic functions, and the like. In addition, the libraries 606 can include API libraries 632 such as media libraries (e.g., libraries to support presentation and manipulation of various media formats such as Moving Picture Experts Group-4 (MPEG4), Advanced Video Coding (H.264 or AVC), Moving Picture Experts Group Layer-3 (MP3), Advanced Audio Coding (AAC), Adaptive Multi-Rate (AMR) audio codec, Joint Photographic Experts Group (JPEG or JPG), or Portable Network Graphics (PNG)), graphics libraries (e.g., an OpenGL framework used to render in two dimensions (2D) and three dimensions (3D) in a graphic context on a display), database libraries (e.g., SQLite to provide various relational database functions), web libraries (e.g., WebKit to provide web browsing functionality), and the like. The libraries 606 may also include other libraries 634.

The software frameworks 608 provide a high-level common infrastructure that can be utilized by the applications 610, according to some embodiments. For example, the software frameworks 608 provide various graphic user interface (GUI) functions, high-level resource management, high-level location services, and so forth. The software frameworks 608 can provide a broad spectrum of other APIs that can be utilized by the applications 610, some of which may be specific to a particular operating system 604 or platform. In various embodiments, the systems, methods, devices, and instructions described herein may use various files, macros, libraries, and other elements of an EDA design environment to implement analysis described herein. This includes analysis of input design files for an integrated circuit design, IP blocks and associated test patterns, functional information for implementing pattern migration from IP blocks to an SOC or ASIC design boundary, or any other such information that may be used as part of or along with the embodiments described herein. While netlist files, library files, SDC files, and viewdefinition files are examples that may operate within the software architecture 602, it will be apparent that other files and structures may provide a similar function, in various embodiments.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various example embodiments, one or more computer systems (e.g., a standalone computer system, a client computer system, or a server computer system) or one or more hardware modules of a computer system (e.g., a processor or a group of processors) are configured by software (e.g., an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA), an SOC, or an ASIC. A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instant in time. For example, where a hardware module comprises a general-purpose processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instant of time and to constitute a different hardware module at a different instant of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines 700 including processors 710), with these operations being accessible via a network (e.g., the Internet) and via one or more appropriate interfaces (e.g., an API). In certain embodiments, for example, a client device may relay or operate in communication with cloud computing systems, and may store media content such as images or videos generated by devices described herein in a cloud environment.

The performance of certain of the operations may be distributed among the processors, not only residing within a single machine 700, but deployed across a number of machines 700. In some example embodiments, the processors 710 or processor-implemented modules are located in a single geographic location (e.g., within a home environment, an office environment, or a server farm). In other example embodiments, the processors 710 or processor-implemented modules are distributed across a number of geographic locations.

Figure 7:
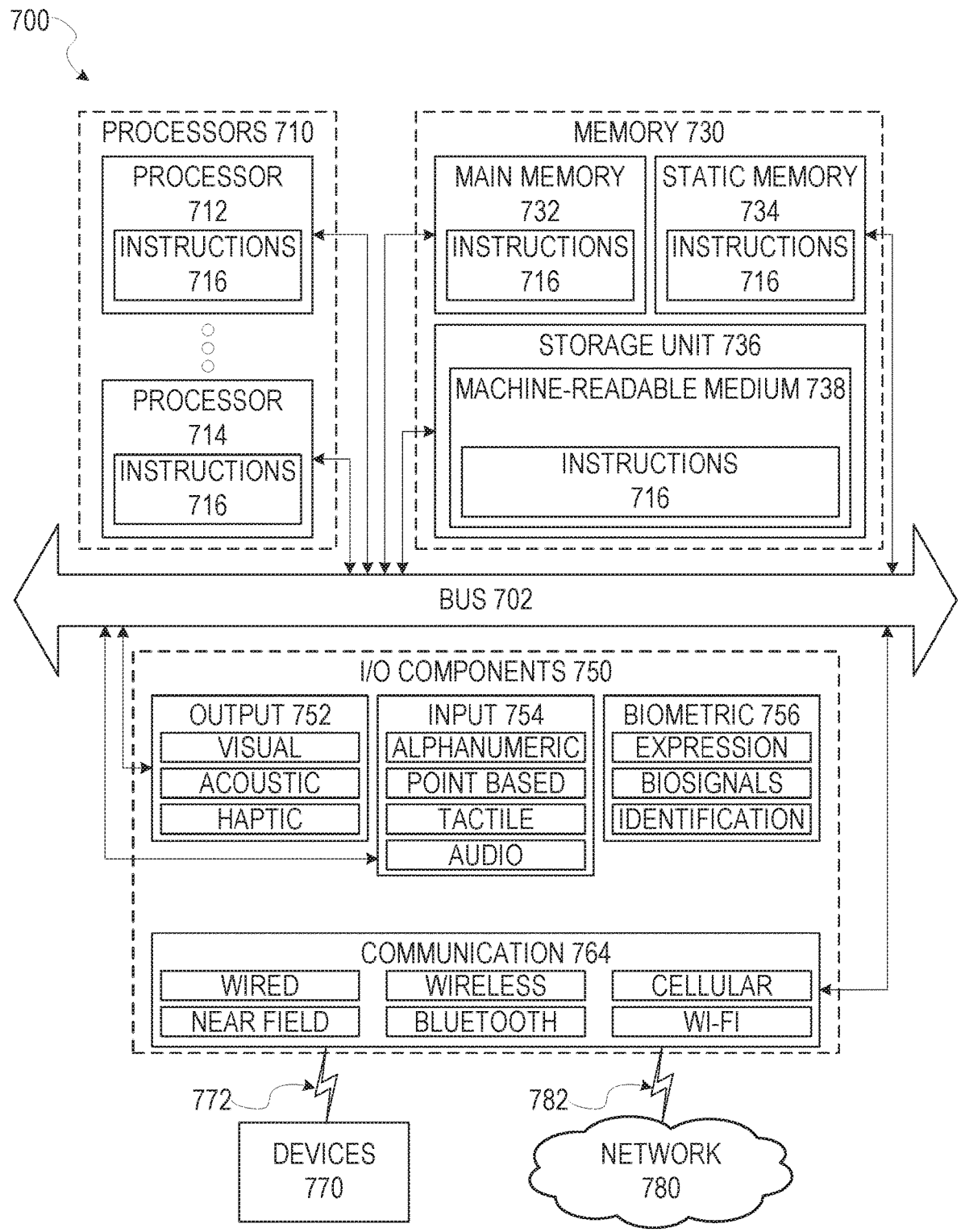
FIG. 7 is a block diagram illustrating an example machine that may implement various embodiments described herein.

FIG. 7 is a diagrammatic representation of the machine 700 in the form of a computer system within which a set of instructions may be executed for causing the machine 700 to perform any one or more of the methodologies discussed herein, according to an example embodiment. FIG. 7 shows components of the machine 700, which is, according to some embodiments, able to read instructions from a machine-readable medium (e.g., a machine-readable storage medium) and perform any one or more of the methodologies discussed herein. In some embodiments, the machine 700 may operate with instructions 716 (e.g., software, a program, an application, an applet, an app, or other executable code) for causing the machine 700 to perform any one or more of the methodologies discussed. In alternative embodiments, the machine 700 operates as a standalone device or can be coupled (e.g., networked) to other machines. In a networked deployment, the machine 700 may operate in the capacity of a server machine or a client machine in a server-client network environment, or as a peer machine in a peer-to-peer (or distributed) network environment. The machine 700 can comprise, but not be limited to, a server computer, a client computer, a personal computer (PC), a tablet computer, a laptop computer, a netbook, a set-top box (STB), a personal digital assistant (PDA), a media system, a cellular telephone, a smart phone, a mobile device, or any machine capable of executing the instructions 716, sequentially or otherwise, that specify actions to be taken by the machine 700. Further, while only a single machine 700 is illustrated, the term "machine" shall also be taken to include a collection of machines 700 that individually or jointly execute the instructions 716 to perform any one or more of the methodologies discussed herein.

In various embodiments, the machine 700 comprises processors 710, memory 730, and I/O components 750, which can be configured to communicate with each other via a bus 702. In an example embodiment, the processors 710 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another processor, or any suitable combination thereof) include, for example, a processor 712 and a processor 714 that may execute the instructions 716. The term "processor" is intended to include multi-core processors 710 that may comprise two or more independent processors 712, 714 (also referred to as "cores") that can execute the instructions 716 contemporaneously. Although FIG. 7 shows multiple processors 710, the machine 700 may include a single processor 712 with a single core, a single processor 712 with multiple cores (e.g., a multi-core processor 712), multiple processors 710 with a single core, multiple processors 710 with multiple cores, or any combination thereof.

The memory 730 comprises a main memory 732, a static memory 734, and a storage unit 736 accessible to the processors 710 via the bus 702, according to some embodiments. The storage unit 736 can include a machine-readable medium 738 on which are stored the instructions 716 embodying any one or more of the methodologies or functions described herein. The instructions 716 can also reside, completely or at least partially, within the main memory 732, within the static memory 734, within at least one of the processors 710 (e.g., within the processor's cache memory), or any suitable combination thereof, during execution thereof by the machine 700. Accordingly, in various embodiments, the main memory 732, the static memory 734, and the processors 710 are considered machine-readable media 738.

As used herein, the term "memory" refers to a machine-readable medium 738 able to store data temporarily or permanently and may be taken to include, but not be limited to, random-access memory (RAM), read-only memory (ROM), buffer memory, flash memory, and cache memory. While the machine-readable medium 738 is shown, in an example embodiment, to be a single medium, the term "machine-readable medium" should be taken to include a single medium or multiple media (e.g., a centralized or distributed database, or associated caches and servers) able to store the instructions 716. The term "machine-readable medium" shall also be taken to include any medium, or combination of multiple media, that is capable of storing instructions (e.g., the instructions 716) for execution by a machine (e.g., the machine 700), such that the instructions 716, when executed by one or more processors of the machine 700 (e.g., the processors 710), cause the machine 700 to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 750 include a wide variety of components to receive input, provide output, produce output, transmit information, exchange information, capture measurements, and so on. In general, it will be appreciated that the I/O components 750 can include many other components that are not shown in FIG. 7. The I/O components 750 are grouped according to functionality merely for simplifying the following discussion, and the grouping is in no way limiting. In various example embodiments, the I/O components 750 include output components 752 and input components 754. The output components 752 include visual components (e.g., a display such as a plasma display panel (PDP), a light-emitting diode (LED) display, a liquid crystal display (LCD), a projector, or a cathode ray tube (CRT)), acoustic components (e.g., speakers), haptic components (e.g., a vibratory motor), other signal generators, and so forth. The input components 754 include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or other pointing instruments), tactile input components (e.g., a physical button, a touch screen that provides location and force of touches or touch gestures, or other tactile input components), audio input components (e.g., a microphone), and the like.

In some embodiments, outputs from an EDA computing device may include design documents, files for additional steps in a design flow 100, or outputs for circuit fabrication. In various embodiments, outputs of a timing analysis are used to generate updates and changes to a circuit design, and after a final closure of timing with all associated timing thresholds and design requirements met, circuit design output files are used to generate masks and other physical outputs for generation of a circuit. As described herein, "requirements," "design elements," and other aspects of a circuit design refer to selectable values that are set as part of the design of a circuit. Such design requirements or elements may be adjusted by a system operator or circuit designer to suit the particular goals of a project or circuit that results from the operations described herein. Embodiments described herein then optimize and improve the operation of a device such as the machine 700 in implementing EDA operations by improving resource usage of the machine 700 or another associated machine (e.g., a circuit tester machine) as part of design, fabrication, and testing of a circuit device.

Communication can be implemented using a wide variety of technologies. The I/O components 750 may include communication components 764 operable to couple the machine 700 to a network 780 or devices 770 via a coupling 782 and a coupling 772, respectively. For example, the communication components 764 include a network interface component or another suitable device to interface with the network 780. In further examples, the communication components 764 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 770 may be another machine or any of a wide variety of peripheral devices (e.g., a peripheral device coupled via a USB).

Language

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, techniques, instruction sequences, and computing machine program products that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A computerized method comprising:
accessing, using one or more hardware processors, a circuit design stored in memory, the circuit design comprising a plurality of instances of one or more blocks, wherein each block of the one or more blocks is associated with a corresponding block test pattern that comprises one or more test subpatterns, wherein the circuit design is associated with a circuit design test pattern, and wherein the circuit design test pattern is associated with a plurality of test cycles;
processing, using the one or more hardware processors, a first block of the one or more blocks to:
identify a set of independent test subpatterns for the first block, each independent test subpattern in the set of independent test subpatterns being separately executable; and
identify a set of test subpattern types for the set of independent test subpatterns by identifying a test subpattern type for each independent test subpattern in the set of independent test subpatterns;
processing, using the one or more hardware processors, a first instance of the first block to identify, based on the set of independent test subpatterns for the first block, first one or more independent test subpatterns for the first instance;
merging, using the one or more hardware processors, the first one or more independent test subpatterns into the circuit design test pattern by merging, based on the set of test subpattern types, at least one independent test subpattern of the first one or more independent test subpatterns with another independent test subpattern of the circuit design test pattern, the at least one independent test subpattern and the other independent test subpattern being a same test subpattern type, the other independent test subpattern being for another instance in the plurality of instances, the merging being such that the at least one independent test is assigned to a first test cycle that is also assigned to the other independent test subpattern; and
initiating, by the one or more hardware processors, testing of a physical circuit using the circuit design test pattern with the first test cycle assigned to the at least one independent test subpattern and the other independent test subpattern such that the physical circuit is tested using the least one independent test subpattern and the other independent test subpattern during a same time period assigned to the first test cycle, the physical circuit being fabricated based on the circuit design.

2. The computerized method of claim 1, wherein the test subpattern type comprises a pin stimulate and measure type.

3. The computerized method of claim 2, merging the first one or more test subpatterns comprises:
accessing an equivalent corresponding test pattern at a chip-level boundary;
identifying clashes in care bits associated with the equivalent corresponding test pattern at the chip-level boundary for possible merge targets; and
merging the first one or more test subpatterns where no clash in care bits is present.

4. The computerized method of claim 1, wherein the test subpattern type comprises a clock pulse and wait for oscillator cycle type.

5. The computerized method of claim 4, the merging the first one or more test subpatterns comprises:
identifying one or more clock pulses at an instance boundary;
for each clock pulse of the one or more clock pulses at the instance boundary, determining an equivalent corresponding clock at a circuit boundary; and
merging the equivalent corresponding clocks when a same clock at a chip boundary is configured to be pulsed for different independent test subpatterns of the circuit design.

6. The computerized method of claim 5, wherein the one or more clock pulses comprise a free-running clock; and wherein merging the equivalent corresponding clocks comprises setting a free-running clock wait time for multiple independent test subpatterns as a maximum wait time for all free-running clocks of the different independent test subpatterns.

7. The computerized method of claim 1, wherein the test subpattern type comprises a pattern scan load and unload type.

8. The computerized method of claim 7, wherein the first one or more test subpatterns comprise scan in data, scan out data, and a scan protocol comprising scan preconditioning data, scan exit data, scan clock data, and scan port data;
wherein the merging the first one or more test subpatterns comprises:
accessing corresponding chip boundary ports associated with the scan port data;
merging the scan in data and the scan out data at a corresponding chip boundary such that care bits do not clash using merged test data for each scan chain;
merging the scan preconditioning data where care bits do not clash; and
merging the scan exit data to create a superset of scan exit data; and wherein the initiating testing of the physical circuit using the circuit design test pattern comprises executing the circuit design test pattern with independent test subpatterns within the circuit design test pattern executed within the circuit design test pattern in an order as provided and as part of the scan protocol.

9. The computerized method of claim 1, wherein the test subpattern type is selected from a group consisting of: a pattern scan load and unload type; a clock pulse and wait for oscillator cycle type; and a pin stimulate and measure type.

10. The computerized method of claim 1, wherein the merging the first one or more test subpatterns associated with the first instance comprises merging the first one or more test subpatterns with other independent test subpatterns of a different test subpattern type.

11. The computerized method of claim 1, further comprising structuring independent test subpatterns sequentially within the circuit design test pattern when an incompatible test subpattern for the first block is not compatible with being merged with any other independent test subpattern of the first block.

12. The computerized method of claim 1, further comprising generating the physical circuit from the circuit design and testing the circuit using the circuit design test pattern.

13. A device comprising:
a memory device; and
one or more processors coupled to the memory device and configured to perform operations comprising:
    accessing, using one or more hardware processors, a circuit design stored in memory, the circuit design comprising a plurality of instances of one or more blocks, wherein each block of the one or more blocks is associated with a corresponding block test pattern that comprises one or more test subpatterns;
    processing, using the one or more hardware processors, each corresponding block test pattern to identify independent test subpatterns;
    processing each instance of the plurality of instances to identify each independent test subpattern associated with the circuit design;
    merging each independent test subpattern associated with the circuit design into a circuit design test pattern, such that at least two of the independent test subpatterns associated with the circuit design occupy shared test cycles of a plurality of test cycles for the circuit design test pattern;
    structuring independent test subpatterns sequentially within the circuit design test pattern when an incompatible test subpattern for a first block is not compatible with being merged with any other independent test subpattern of the first block; and
    storing, using the memory device, the circuit design test pattern for use with testing a physical circuit fabricated based on the circuit design.

14. The device of claim 13, wherein the one or more processors are further configured to perform additional operations comprising:
    processing each block to identify a test subpattern type for each independent test subpattern of each block, wherein the test subpattern type is selected from a group consisting of: a pattern scan load and unload type; a clock pulse and wait for oscillator cycle type; and a pin stimulate and measure type.

15. The device of claim 14, wherein the merging each independent test subpattern associated with the circuit design into the circuit design test pattern is based on an identified test subpattern type corresponding to the independent test subpattern.

16. The device of claim 13, wherein the operations further comprise:
    generating the physical circuit from the circuit design and testing the circuit using the stored circuit design test pattern.

17. A non-transitory computer-readable medium comprising instructions that, when executed by one or more processors of a device, cause the device to perform operations comprising:
    accessing a circuit design stored in memory, the circuit design comprising a plurality of instances of one or more blocks, wherein each block of the one or more blocks is associated with a corresponding block test pattern comprising one or more test subpatterns, wherein the circuit design is associated with a circuit design test pattern, and wherein the circuit design test pattern is associated with a plurality of test cycles;
    processing, a first block of the one or more blocks to identify a set of independent test subpatterns for the first block;
    processing, a first instance of the first block to identify first one or more test subpatterns associated with the first instance of the first block;
    processing the first one or more test subpatterns associated with the first instance of the first block to determine a test subpattern type for each test subpattern, wherein the test subpattern type comprises a clock pulse and wait for oscillator cycle type;
    merging the first one or more test subpatterns associated with the first instance of the first block by the test subpattern type into the circuit design test pattern such that at least a first test subpattern of the first one or more test subpatterns is assigned to a first test cycle that is also assigned to a second test subpattern of the first one or more test subpatterns, wherein the merging the first one or more test subpatterns comprises:
        identifying one or more clock pulses at an instance boundary;
        for each clock pulse of the one or more clock pulses at the instance boundary, determining an equivalent corresponding clock at a circuit boundary; and
        merging the equivalent corresponding clocks when a same clock at a chip boundary is configured to be pulsed for different independent test subpatterns of the circuit design; and
    initiating testing of a circuit using the circuit design test pattern with the first test cycle assigned to the first test subpattern and the second test subpattern such that a physical circuit is tested using the first test subpattern and the second test subpattern during a same time period assigned to the first test cycle, the physical circuit being fabricated based on the circuit design.

18. The non-transitory computer-readable medium of claim 17, wherein the operations further comprise:
    processing-a second block of the one or more blocks to identify a second set of independent test subpatterns for the second block;
    processing-a second instance of the second block to identify second one or more test subpatterns associated with the second instance of the second block;
    processing the second one or more test subpatterns associated with the second instance of the second block to determine a second test subpattern type for each test subpattern of the second one or more test subpatterns, wherein the second test subpattern type comprises a pattern scan load and unload type;

merging the second one or more test subpatterns associated with the second instance of the second block by the second test subpattern type into the circuit design test pattern;

wherein the second one or more test subpatterns comprise scan in data, scan out data, and a scan protocol comprising scan preconditioning data, scan exit data, scan clock data, and scan port data; and wherein the merging the second one or more test subpatterns comprises:
- accessing corresponding chip boundary ports associated with the scan port data;
- merging the scan in data and the scan out data at a corresponding chip boundary such that care bits do not clash using merged test data for each scan chain;
- merging the scan preconditioning data where care bits do not clash; and
- merging the scan exit data to create a superset of scan exit data.

19. The non-transitory computer-readable medium of claim 17, wherein the one or more clock pulses comprise a free-running clock; and wherein merging the equivalent corresponding clocks comprises setting a free-running clock wait time for multiple independent test subpatterns as a maximum wait time for all free-running clocks of the different independent test subpatterns.

20. The non-transitory computer-readable medium of claim 17, wherein the operations further comprise:
generating the physical circuit from the circuit design and testing the circuit using the circuit design test pattern.

\* \* \* \* \*